United States Patent
Sharon et al.

(10) Patent No.: US 8,880,987 B2
(45) Date of Patent: Nov. 4, 2014

(54) CHECKSUM USING SUMS OF PERMUTATION SUB-MATRICES

(75) Inventors: Eran Sharon, Rishon Lezion (IL); Idan Alrod, Herzliya (IL)

(73) Assignee: Sandisk Technologies Inc., Plano, TX (US)

( * ) Notice: Subject to any disclaimer, the term of this patent is extended or adjusted under 35 U.S.C. 154(b) by 133 days.

(21) Appl. No.: 13/558,846

(22) Filed: Jul. 26, 2012

(65) Prior Publication Data

US 2013/0031440 A1    Jan. 31, 2013

Related U.S. Application Data

(60) Provisional application No. 61/513,186, filed on Jul. 29, 2011.

(51) Int. Cl.
*G06F 9/02* (2006.01)
*H03M 13/09* (2006.01)
*H03M 13/29* (2006.01)
*H03M 13/11* (2006.01)
*G06F 11/10* (2006.01)

(52) U.S. Cl.
CPC .......... *H03M 13/09* (2013.01); *H03M 13/2906* (2013.01); *H03M 13/2927* (2013.01); *H03M 13/116* (2013.01); *H03M 13/1128* (2013.01); *G06F 11/1012* (2013.01)
USPC .............................. 714/801; 714/785; 714/752

(58) Field of Classification Search
CPC ................................... G06F 9/02; G06F 9/305
USPC .......... 714/801, 709, 745, 780, 785, 752, 781
See application file for complete search history.

(56) References Cited

U.S. PATENT DOCUMENTS

| | | | | |
|---|---|---|---|---|
| 6,070,182 | A * | 5/2000 | Rao et al. | 708/708 |
| 6,658,478 | B1 * | 12/2003 | Singhal et al. | 709/232 |
| 7,669,109 | B2 * | 2/2010 | Hocevar | 714/780 |
| 7,805,652 | B1 | 9/2010 | Varnica | |
| 8,381,083 | B2 * | 2/2013 | Wezelenburg et al. | 714/785 |
| 8,464,123 | B2 * | 6/2013 | Alrod et al. | 714/752 |
| 8,612,834 | B2 * | 12/2013 | Kwok et al. | 714/781 |
| 2009/0282316 | A1 | 11/2009 | Lingam et al. | |
| 2011/0029835 | A1 | 2/2011 | Li et al. | |

FOREIGN PATENT DOCUMENTS

WO    2008021930 A2    2/2008

OTHER PUBLICATIONS

The International Search Report and Written Opinion mailed Mar. 19, 2013 in International Application No. PCT/US2012/048364, 15 pages.
Spencer, Quentin H. "Error Correction Using a Message-Passing Decoder to Process Cyclic Redundancy Checks," IEEE Global Telecommunications Conference, GLOBECOM 2006, Nov. 1, 2006, 5 pages.

(Continued)

*Primary Examiner* — Fritz Alphonse
(74) *Attorney, Agent, or Firm* — Toler Law Group, PC

(57) ABSTRACT

A method for encoding data bits includes computing checksum parity bits based on the data bits. A set of equations satisfied by the data bits and the checksum parity bits corresponds to a dense parity-check matrix. The dense parity-check matrix comprises sums of permutation sub-matrices.

20 Claims, 7 Drawing Sheets

(56) References Cited

OTHER PUBLICATIONS

Han, Guojun et al. "A Unified Early Stopping Criterion for Binary and Nonbinary LDPC Codes Based on Check-Sum Variation Patterns," IEEE Communications Letters, vol. 14, No. 11, Nov. 2010, pp. 1053-1055.

Kwon, Yeong-Hyeon. "A New LDPC Decoding Algorithm Aided by Segmented CRCs for Erasure Channels," IEEE Proceedings of the 61st Vehicular Technology Conference, VTC2005—Spring, Stockholm, Sweden, May 30, 2005-Jun. 1, 2005, vol. 1, pp. 705-708.

International Preliminary Report on Patentability for International Application No. PCT/US2012/048364, issued Feb. 4, 2014, 9 pages.

* cited by examiner

CHECKSUM USING SUMS OF PERMUTATION SUB-MATRICES

CROSS-REFERENCE TO RELATED APPLICATIONS

The present application claims priority to U.S. Provisional Application No. 61/513,186, filed Jul. 29, 2011, which application is hereby incorporated by reference in its entirety.

FIELD OF THE DISCLOSURE

The present disclosure is generally related to encoding data and decoding data.

BACKGROUND

Flash memory has become increasingly popular in recent years. Flash memory is used in numerous applications including mobile phones, digital cameras, music players, and many other applications. A major emerging application is the use of flash memory as Solid State Disc (SSD). Such memories may be implemented using high density Multi-Level Cell (MLC) memories with redundancy such as advanced Error Correction Coding (ECC) schemes. For example, advanced ECC schemes include iterative coding schemes based on Low-Density Parity-Check (LDPC) or Turbo codes.

Error correction codes are commonly used in memories in order to provide data reliability and integrity, by dealing with errors that are introduced by the physical medium during its programming or reading or during storage. An error correction code is a set of codewords that satisfy a given set of constraints. One commonly used class of error correction codes is the class of binary linear block codes, in which the code is defined through a set of parity-check constraints on the codeword bits. In other words, a binary linear block code is defined by a set of linear equations over the two-element Galois field GF(2) that a valid codeword should satisfy. The set of linear equations can be conveniently described via a parity-check matrix H of M rows, such that each row of the matrix defines one parity-check constraint and a word C constitutes a valid codeword if and only if H·C=0 (over GF(2)). The vector S=H·C is commonly known as the syndrome vector associated with the word C. This syndrome may be referred to as the "error correction" syndrome to distinguish it from a different syndrome, the "cyclic redundancy check (CRC)" or "checksum" syndrome. Each element of the syndrome vector is associated with one of the parity check equations, and the value of the element is 0 for an equation that is satisfied by C and 1 for an equation that is not satisfied by C. The elements of the syndrome vector also are called "bits" of the syndrome vector herein. The syndrome weight ($W_s$) is the number of unsatisfied equations represented by the syndrome vector S. So, for a word to be a valid codeword the syndrome vector associated with the word must be all zeros and its syndrome weight must be 0.

Error correction codes may be based on iterative coding schemes, such as LDPC and Turbo codes. In iterative coding schemes, decoding is performed using an iterative algorithm that iteratively updates its estimates of the codeword bits until the algorithm converges to a valid codeword. The iteratively updated estimates can be either "hard" estimates (1 vs. 0) or "soft" estimates, which are composed of an estimate of the bit's value (1 or 0), together with some reliability measure of the estimate indicating the probability that the estimated value is correct. A commonly used soft estimate is the Log Likelihood Ratio (LLR), the ratio of the probability of the bit being 0 to the probability of the bit being 1. A positive LLR means that the bit is estimated to be more likely to be 0 than 1. A negative LLR means that the bit is estimated to be more likely to be 1 than 0. The absolute value of the LLR is an indication of the certainty of the estimate. An estimate of a bit may "flip", meaning that the value of the bit estimate changes: for example, a hard estimate changes from 0 to 1 or from 1 to 0, or the sign of a LLR changes from positive to negative or from negative to positive. (Similarly, "flipping" a bit of a syndrome vector indicates changing the bit from 1 to 0 or from 0 to 1.) The decoder is initialized with initial a-priori (possibly "soft") estimates of the bits. These estimates are then processed and updated iteratively. The decoding can terminate after a fixed number of iterations. Alternatively, a convergence detection mechanism can terminate the decoding once all the parity check constraints are satisfied by the current bit estimates.

Another option for early decoding termination is by a "divergence" detection mechanism, which detects that the probability for decoder convergence is low and hence it is more efficient to terminate the current decoding attempt and retry decoding after updating the decoder initialization values. One option for performing such divergence detection is based on the current number of unsatisfied parity-check constraints being too high. Another option for divergence detection is based on the evolution of the number of unsatisfied parity-checks during decoding. In case of such early termination, the decoding may be repeated with updated initialization values, after changing certain parameters, such as the memory reading thresholds or reading resolution, such that the probability of successful decoding convergence in the repeated attempt is increased.

After convergence of an iterative decoding process to a valid codeword, a checksum may be performed on the resulting codeword to determine whether the decoding process has converged on an incorrect codeword. For example, a codeword may encode data bits along with CRC parity bits corresponding to the data bits. However, performing CRC processing on a codeword that results from an iterative decoding process may introduce additional decoding delay.

SUMMARY

A checksum structure is disclosed that allows for "on-the-fly" checksum computation without introducing post-iteration decoding delay. The checksum can be efficiently generated and is compatible with the data path of an LDPC decoder for Quasi-Cyclic LDPC (QC-LDPC) codes. Moreover, the checksum may be as effective as conventional CRC in detecting errors which were un-detected by the LDPC decoder.

BRIEF DESCRIPTION OF THE DRAWINGS

Various embodiments are herein described, by way of example only, with reference to the accompanying drawings, wherein.

DETAILED DESCRIPTION

Figure 1:
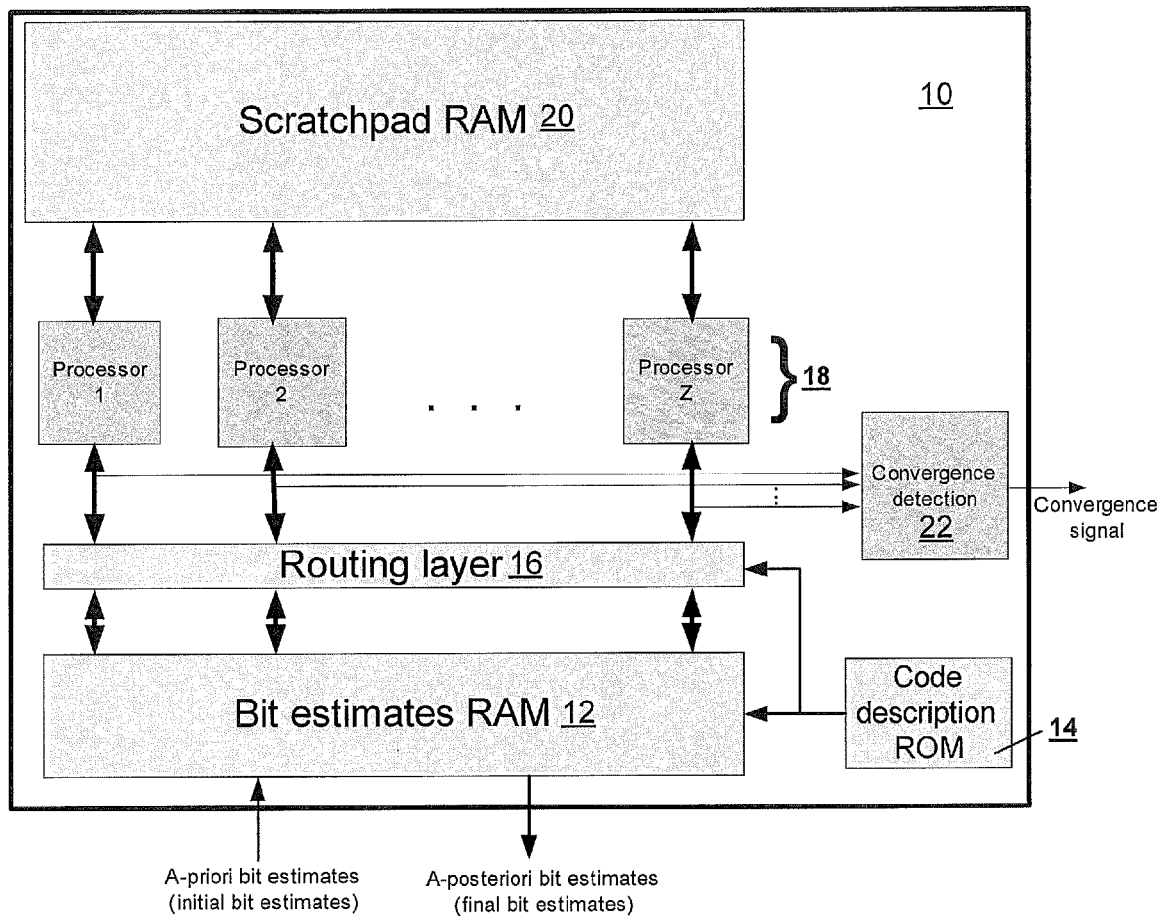
FIG. 1 is a block diagram of an iterative decoder.

Referring to the drawings, FIG. 1 shows a block diagram of an iterative decoder 10. Initial bit estimates are stored in a bit estimates random access memory (RAM) 12. A read-only memory (ROM) 14 is used for storing a code description. For example, ROM 14 may store an indication of which bits participate in each parity check constraint (i.e. ROM 14 stores the parity check matrix H that defines the code). The bit estimates are read from bit estimates RAM 12 through a routing layer 16 into several processing units 18. Code description ROM 14 controls the routing of the bit estimates into processing units 18. Processing units 18 update the bit estimates based on the parity-check constraints that the bits should satisfy. A scratchpad RAM 20 may be used by processing units 18 for storing temporary data required for updating the bit estimates. The updating of the bit estimates is done iteratively, one or more bit estimates at a time, where an iteration may involve updating the bit estimates based on all the parity-check constraints that the bit estimates should satisfy (i.e. "traversing" code description ROM 14 once). Decoding can terminate after a predetermined number of iterations or according to a convergence signal generated by a convergence detection block 22, once convergence detection block 22 detects that all the parity check constraints are satisfied by the current bit estimates (for example, by testing whether the syndrome weight is zero).

A decoding "iteration" may be defined as considering each of the parity-check equations that define the code, and updating the estimates of the codeword bits that are associated with each parity-check equation, according to a certain schedule, until all the parity check equations have been considered. For example, LDPC decoding usually is formulated as message passing among the nodes of a "Tanner graph" whose edges connect nodes that represent the codeword bits with nodes that represent parity-checks that the codeword bits should satisfy. Examples of message-passing schedules for LDPC decoding on a Tanner graph include the following:

1. Traverse all the parity-check nodes, passing messages from each parity-check node to the codeword bit nodes to which that parity-check node is connected by edges of the graph. Update the codeword bit estimates according to the messages received at the codeword bit nodes. Then traverse all the codeword bit nodes, passing messages from each codeword bit node to the parity-check nodes to which that codeword bit node is connected by edges of the graph. Update the parity-check bit estimates according to the messages received at the parity-check nodes.

2. Traverse all the codeword bit nodes, passing messages from each codeword bit node to the parity-check nodes to which that codeword bit node is connected by edges of the graph. Update the parity-check bit estimates according to the messages received at the parity-check nodes. Then traverse all the parity-check nodes, passing messages from each parity-check node to the codeword bit nodes to which that parity-check node is connected by edges of the graph. Update the codeword bit estimates according to the messages received at the codeword bit nodes.

3. Traverse all the parity-check nodes. At each parity-check node, pass messages to the parity-check node from the codeword bit nodes that are connected to that parity check node by edges of the graph, update the parity-check bit estimate according to the messages received at the parity-check node, send messages back from the parity-check node to those codeword bit nodes, and update the codeword bit estimates at those codeword bit nodes according to the messages received from the parity check node.

4. Traverse all the codeword bit nodes. At each codeword bit node, pass messages to the codeword bit node from the parity-check nodes that are connected to that codeword bit node by edges of the graph, update the codeword bit estimate according to the messages received at the codeword bit node, send messages back from the codeword bit node to those parity-check nodes, and update the parity-check bit estimates at those parity-check nodes according to the messages received from the codeword bit node.

An "iteration" continues until its associated schedule has been completed.

Flash memories intended for applications such as SSD and mobile may require very high random input/output (I/O) performance. During reading, this implies usage of very fast ECC decoders. In order to achieve fast decoding in iterative coding schemes a fast convergence detection apparatus may be provided. Convergence detection block 22 enables faster decoding time (due to early termination) and lower energy consumption by decoder 10.

Convergence detection in iterative decoders may include computing the syndrome vector $S = H \cdot \hat{C}$ at the end of each decoding iteration (where $\hat{C}$ is the vector of bit estimates at the end of the iteration) and checking whether all the parity-checks are satisfied (i.e. whether the syndrome weight is zero). Dedicated processing may be performed at the end of each iteration in order to compute the syndrome vector, which may prolong the decoding time expense of decoding iterations.

Iterative decoders that are based on serial schedules in which the parity-check equations of the code are processed one after another may perform semi-on-the-fly convergence detection. According to this approach, a counter holding the number of satisfied parity-checks is maintained. At the beginning of decoding this counter is set to zero. During decoding the code's parity-checks are traversed serially and iteratively and the bit estimates are updated based on each of the parity-checks. As part of this decoding process, the syndrome bit of each parity-check is computed when the parity-check is traversed. If the syndrome bit is zero (i.e. the parity-check is satisfied) then the counter is incremented, otherwise, the counter is reset to zero. The counter is also reset to zero each time one of the codeword bits changes value, because previously computed syndrome bits are not valid anymore. Once the counter reaches M, (recall that M is the number of parity-check equations that the codeword should satisfy, which is the dimension of H), convergence is detected and decoding is terminated.

This semi-on-the-fly convergence detection mechanism introduces little additional complexity. However, it provides delayed convergence detection, as it detects the convergence a full iteration after the decoder has converged to a valid codeword. The reason is that a full number of satisfied parity-checks are counted after the last bit to flip flips its value (as value flipping resets the counter). In a high-error scenario, such as decoding data read from a flash memory long after the data were stored and/or after the flash memory has endured many write/erase cycles, several iterations (e.g. ten or more iterations) may be required for convergence, so adding one more iteration after the last bit flips may add 10% to the convergence time or less. However, in low-error environments such as a fresh flash memory, one or two iterations may suffice for decoding a codeword, so that adding a full iteration after the last bit flip can add 50% to 100% to the decoding time.

Real-time, "on-the-fly", convergence testing may be provided. Such real-time convergence testing may be used for applications such as SSD and i-NAND to improve read throughputs. Real time convergence testing may be used in random I/O performance that may benefit from very fast decoders. Moreover, the random I/O performance may be measured when the Flash memory is fresh (low cycling) and its error rate is low. In this case, a decoder can converge to a valid codeword after only one or two iterations. In this case using convergence detection methods such as the semi-on-the-fly convergence detection method would introduce a delay of about one iteration, which would increase the decoding time by about 50% to 100%, which may degrade the random I/O performance.

A method of decoding a representation of a codeword that includes a plurality of codeword bits, may include: (a) during at least one iteration, of an iterative decoding algorithm, in which respective estimates of the codeword bits are updated according to a schedule, computing a termination indication of the algorithm; and (b) testing the termination indication to determine whether to terminate the decoding; wherein the testing of the termination indication shows whether to terminate the decoding despite at least one of the respective estimates of the codeword bits having flipped during an immediately preceding traversal of the schedule.

A decoder, for decoding a representation of a codeword that includes a plurality of codeword bits, may comprise circuitry for: (a) during at least one iteration, of an iterative decoding algorithm, in which respective estimates of the codeword bits are updated according to a schedule, computing a termination indication of the algorithm; and (b) testing the termination indication to determine whether to terminate the decoding; wherein the testing of the termination indication shows whether to terminate the decoding despite at least one of the respective estimates of the codeword bits having flipped during an immediately preceding traversal of the schedule.

A method of decoding a representation of a codeword that includes a plurality of codeword bits, may include during each of at least one iteration of an iterative decoding algorithm: in response to a flipping of a respective estimate of one of the codeword bits: (a) updating a termination indication that is a function of a syndrome of the estimates of the codeword bits, the syndrome including a plurality of syndrome bits; and (b) testing the termination indication.

A decoder, for decoding a representation of a codeword that includes a plurality of codeword bits, may include circuitry for, during each of at least one iteration of an iterative decoding algorithm: in response to a flipping of a respective estimate of one of the codeword bits: (a) updating a termination indication that is a function of a syndrome of the estimates of the codeword bits, the syndrome including a plurality of syndrome bits; and (b) testing the termination indication.

A representation of a codeword that includes a plurality of codeword bits may be decoded. What is decoded is a "representation" of a codeword and not an actual codeword because what is decoded is a codeword that may have become contaminated with noise and so is no longer a valid codeword. For example, an application may be to recover data that has been stored in a nonvolatile memory such as a flash memory as one or more codewords but that has changed due to degradation of the flash memory over time or that has been changed by the process of reading the data from the memory. Another application may be to correct errors that accumulate in codewords transmitted via a noisy transmission channel. If the input to the methods is a valid codeword, there may be no need for decoding.

During one or more iterations of an iterative decoding algorithm that follows a schedule as described above for updating estimates of the codeword bits, a termination indication of the algorithm may be computed. That the termination indication is computed "during" the iteration means that at least some of the computations that produce the termination indication are performed before all the scheduled codeword bit estimate updates of the iteration have been completed. "Updating" a codeword bit estimate means performing operations on the estimate that are intended to improve the estimate. These operations may or may not flip the estimate. For example, updating a LLR estimate may only change the magnitude of the estimate without changing the sign of the estimate.

The termination indication can be a convergence indication that is tested to determine whether the algorithm has converged by producing a valid codeword or a divergence indication that is tested to determine whether the algorithm is likely to not converge. The computation of the termination indication is such that the testing shows whether to terminate the decoding despite one or more of the codeword bit estimates having flipped during a traversal of the schedule that immediately precedes the testing. A "traversal" of a schedule means starting at a point in the schedule and returning to that point in the schedule. If the point is at the start or at the end of the schedule then the traversal is equivalent to an iteration; otherwise, the traversal crosses a boundary between two iterations.

In the case of the termination indication being a convergence indication, the termination indication may be computed during the iteration rather than after the iteration. Convergence may be indicated despite recent flips of one or more of the codeword bit estimates.

If the testing of the termination indication indicates that the algorithm has converged, the decoding may be terminated. Additionally or alternatively, if the testing of the termination indication indicates that the algorithm is likely to not converge, the decoding may be terminated.

Testing of the termination indication during the iteration may be effected at least whenever a codeword bit estimate is flipped.

Computing of the termination indication may include ORing all of a plurality of bits of an error correction syndrome.

If the codeword is a codeword of a code, such as a binary linear block code, for which an error correction syndrome of the codeword bit estimates is defined, then the termination indication may include the weight of the error correction syndrome. The testing of the termination indication includes comparing the weight of the error correction syndrome to a threshold. For convergence detection, the threshold is zero.

The computing of the termination indication may include, in response to one of the codeword bit estimates being flipped, flipping every bit of the error correction syndrome that is influenced by that codeword bit estimate. An error correction syndrome bit is influenced by a codeword bit estimate if that codeword bit participates in the parity check equation of that error correction syndrome bit. The computing of the termination indication may include, in response to one of the codeword bit estimates being flipped, updating the error correction syndrome weight in accordance with the flips of the error correction syndrome bits that are influenced by the codeword bit estimate that is flipped. The flipping of the bit(s) of the error correction syndrome that is/are influenced by the codeword bit flip and/or the updating of the error correction syndrome weight may be substantially simultaneous with the codeword bit flip that triggers the updating of the error correction syndrome weight. Alternatively, the flipping of the bit(s) of the error correction syndrome that is/are influenced by the codeword bit flip and/or the updating of the error correction syndrome weight may be scheduled to be effected subsequent to the codeword bit flip that triggers the updating of the error correction syndrome. Such scheduling may include storing, in a queuing buffer such as a FIFO buffer, requests to flip every error correction syndrome bit that is influenced by the codeword bit flip. If the queuing buffer overflows, the decoding method may revert to another of the methods of terminating decoding that are discussed above. The error correction syndrome may be initialized before any of the iterations of the algorithm. Alternatively, the iterations during which the termination indication is computed may all be subsequent to the first iteration of the algorithm, and the error correction syndrome may be initialized during the first iteration of the algorithm. Such initializing may be combined with, and performed substantially simultaneously with, pre-scheduled flipping of error correction syndrome bits in response to the flipping of codeword bit estimates in the first iteration.

During each iteration during which the termination indication is computed, at least a partial update of a checksum syndrome of the codeword bit estimates may be computed.

A decoder for implementing a method for decoding a representation of a codeword that includes a plurality of codeword bits may include circuitry for implementing the method.

The circuitry may include a plurality of XOR gates for computing all of a plurality of bits of an error correction syndrome and an OR gate for combining the outputs of the XOR gates.

For a code, such as a binary linear block code, for which an error correction syndrome of the codeword bit estimates is defined, the termination indication may include the weight of the error correction syndrome. Testing of the termination indication may include comparing the weight of the error correction syndrome to a threshold, and the computing of the termination indication may include, in response to one of the codeword bit estimates being flipped, changing the sign of every bit of the error correction syndrome that is influenced by that codeword bit estimate. For convergence detection, the threshold is zero. The circuitry may include an error correction syndrome update block for updating both the bits of the error correction syndrome and the weight of the error correction syndrome in response to flips of the codeword bit estimates. The circuitry may include a plurality of registers for storing the bits of the error correction syndrome, so that the updates of the error correction syndrome bits and of the error correction syndrome weight can be simultaneous with the updates of the codeword bits. Alternatively, the circuitry may include, instead of such registers, a random access memory for storing the bits of the error correction syndrome and a queuing buffer such as a FIFO buffer for scheduling the updates of the error correction bits and of the error correction syndrome weight, because if only a small portion of the codeword bit estimates are expected to be flipped when updated, then the updates of the error correction syndrome bits and of the error correction syndrome weight may be delayed relative to the updates of the codeword bits.

The decoder may include circuitry for, during each iteration of the decoding algorithm in which the termination indication is computed, effecting at least a partial update of a checksum syndrome of the codeword bit estimates.

The flipping of the estimate of a codeword bit during an iteration of an iterative decoding algorithm may be responded to by updating a termination indication that is a function of a syndrome of the codeword bit estimates and testing the updated termination indication. The termination indication can be a convergence indication that is tested to determine whether the algorithm has converged by producing a valid codeword or a divergence indication that is tested to determine whether the algorithm is likely to not converge. In the case of the termination indication being a convergence indication, the convergence indication may be updated in response to a codeword bit flip rather than in response to finishing an iteration, and the convergence indication may be updated rather than being re-set in response to codeword bit flips.

If the testing shows that the algorithm has converged, the decoding may be terminated. Additionally or alternatively, if the testing indicates that the algorithm is likely to not converge, the decoding may be terminated.

The termination indication may be a function of a weight of the syndrome prior to the flipping of the codeword bit estimate and of each syndrome bit that is influenced by that codeword bit estimate.

The updating and the testing may be effected before continuing the iteration. For example, if the iterative decoding algorithm is a LDPC message passing algorithm that, in each iteration, traverses all the parity-check nodes, and a codeword bit estimate may be flipped as a result of the message passing associated with one of the parity-check nodes, then the termination indication is updated and tested before any message are passed from any subsequent parity-check nodes.

Real-time convergence detection may be implemented in iterative decoders. The impact of each codeword bit that is flipped during the decoding of the syndrome vector and syndrome weight may be calculated in real time (or almost in real time) by flipping all the syndrome bits corresponding to parity checks in which the flipped bit participates.

Figure 2:
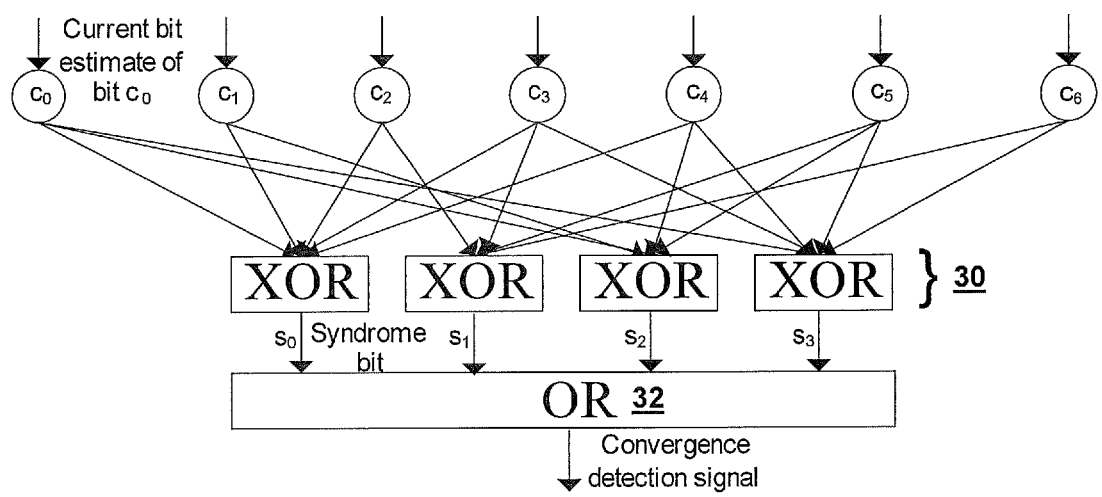
FIG. 2 illustrates a first embodiment of circuitry for real-time decoder convergence detection.

An implementation of real-time convergence detection is shown in FIG. 2. Each parity check equation is represented by an XOR gate 30 whose inputs are the current bit estimates (represented as the circles in FIG. 2) of the bits participating in the parity-check equation. Each check equation XOR gate 30 outputs one of the syndrome bits. An OR operation is performed on the syndrome bits to produce a convergence detection signal. As soon as the convergence detection signal equals zero, the bit estimates constitute a valid codeword and the decoding can be terminated.

The implementation depicted in FIG. 2 may include a complex interconnect layer which computes the syndrome bits, which may be difficult to implement for long codes. Note that codes used in iterative coding schemes are usually based on sparse parity check matrices (hence the name "Low-Density" Parity-Check codes). This means that each bit participates in a small number of parity-check equations (usually between three and six parity checks on the average). This in turn simplifies the interconnect layer used for computing the syndrome bits. On the other hand, iterative coding schemes are usually based on very long codes. Hence, overall, the interconnect layer may be too complex for the implementation illustrated in FIG. 2.

Figure 3:
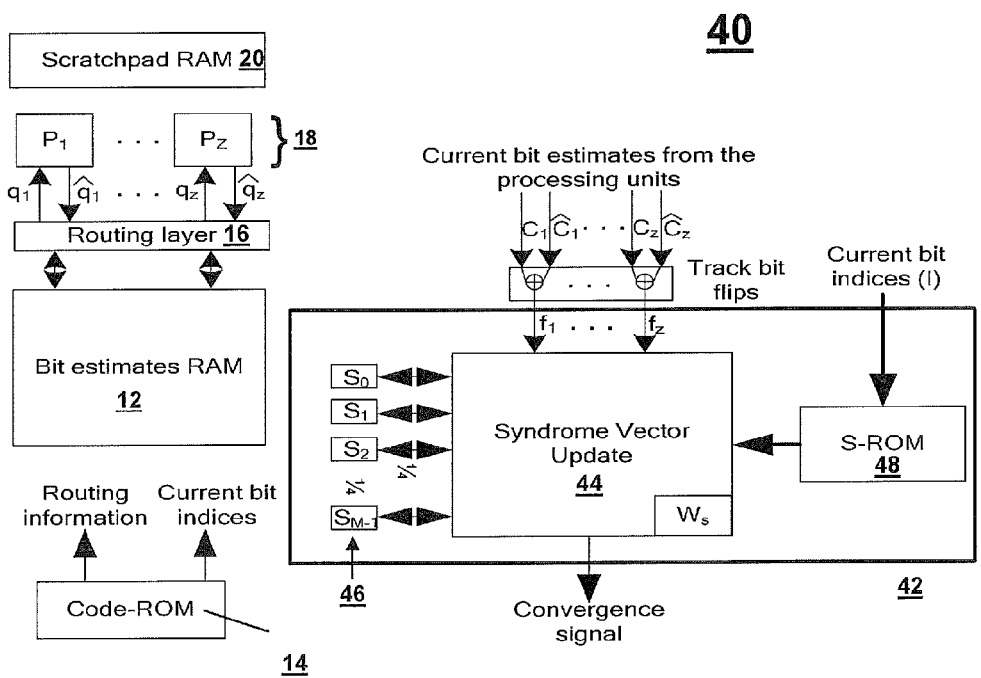
FIG. 3 illustrates a first embodiment of a decoder for real-time decoder convergence detection.

Circuitry for implementing real time convergence detection block, that does not require the complex interconnect layer of FIG. 2, is shown in FIG. 3. Decoder 40 of FIG. 3 may be identical to decoder 10 of FIG. 1, except for the substitution of convergence detection block 42 for the convergence detection block 22 of FIG. 2. Let $I=[i_1 \, i_2 \ldots i_z]$ denote the indices of the set of bits whose "soft" bit estimates are currently updated by the decoder's Z processing units 18. Let $Q=[q_1 \, q_2 \ldots q_z]$ and $\hat{Q}=[\hat{q}_1 \, \hat{q}_2 \ldots \hat{q}_z]$ denote the "soft" bit estimates of these bits, prior to and after their updating by the processing units, respectively. Let $C=[c_1 \, c_2 \ldots c_z]$ and $\hat{C}=[\hat{c}_1 \, \hat{c}_2 \ldots \hat{c}_z]$ denote the corresponding "hard" decisions (i.e. 0/1 bit values) of Q and $\hat{Q}$, respectively. Let $F=[f_1=c_1 \oplus \hat{c}_1 \ldots f_z=c_z \oplus \hat{c}_z]^T$ denote a column vector of bit flip indicators (i.e. f=1 if the corresponding bit flipped its value and 0 otherwise). Let $S=[s_0 \, s_1, \ldots s_{M-1}]^T$ denote the syndrome vector (as a column vector) and $W_s$ the syndrome weight counter. Convergence detection block 42 operates as follows:

The syndrome vector S and the syndrome weight counter $W_s$ are reset to zero prior to decoding.

2) The initial syndrome vector and the initial syndrome weight are computed during decoder initialization based on the initial a-priori bit estimates.

Each time a new set of bit estimates is computed by processing units 18 (e.g. each clock), the syndrome vector S and the syndrome weight counter $W_s$ are updated accordingly. This is done by the syndrome vector update block 44, which updates the relevant set of syndrome bits corresponding to parity-check constraints in which the current set of bits (with indices in I) participates.

The syndrome vector is stored in an array 46 of registers (in order to allow access and updating of any number of syndrome bits simultaneously). An S-ROM 48 stores the columns of the code's parity-check matrix H. In this case, syndrome vector update block 44 updates the syndrome vector as follows: $S=S \oplus (H(I) \cdot F)$, where H(I) is a M×Z submatrix, of the code's parity-check matrix H, that include only the columns with indices in I. Alternatively, $S=S \oplus H(I_{f=1})$, where $I_{f=1}$ is a subset of the indices set I including only the indices of the bits which flipped sign (i.e. bits for which f=1).

Note that in iterative coding schemes, like the ones based on LDPC codes, the parity-check matrix H is sparse and the average number of 1's in a column of H is small (typically between three and six), while the dimension M of H may be a few hundreds or thousands or more (i.e. a bit participates on the average in only between three and six parity-checks out of the M parity-checks of the code). Hence, instead of storing the columns of H in S-ROM 48, it may be more efficient, both in terms of S-ROM size and in terms of the syndrome vector update complexity, to store only the indices of the syndrome bits in which each codeword bit participates. This way, given a set of codeword bit indices I, S-ROM 48 outputs a set of syndrome bit indices J(I), corresponding to the parity-checks in which the codeword bits participate. Furthermore, it is common to use LDPC codes (e.g. quasi-cyclic LDPC codes) whose parity-check matrix H is arranged such that each set of bits that is processed simultaneously doesn't participate in common parity-checks. In other words, if $i_1, i_2 \in I$ then $J(i_1) \cap J(i_2)=\emptyset$. In this case the syndrome vector updating may be done simply by flipping the relevant syndrome bits as follows: $S(J(I_{f=1}))=NOT \, (S(J(I_{f=1})))$, where S(J) denotes a subset of the syndrome bits in S with indices J.

The syndrome weight is updated in conjunction with updating of the syndrome vector. The syndrome weight is the sum of the elements of the syndrome vector. The syndrome weight can be updated in an incremental manner: $W_s=W_s+N_{0 \to 1}-N_{1 \to 0}$, where $N_{0 \to 1}$ is the number of syndrome bits that flipped from 0 to 1 in the current syndrome vector updating step and $N_{1 \to 0}$ is the number of syndrome bits flipped from 1 to 0 in the current syndrome vector updating step.

Decoding is terminated as soon as $W_s=0$, as this indicates that the syndrome vector is zeroed and that the decoder has converged to a valid codeword.

Figure 4:
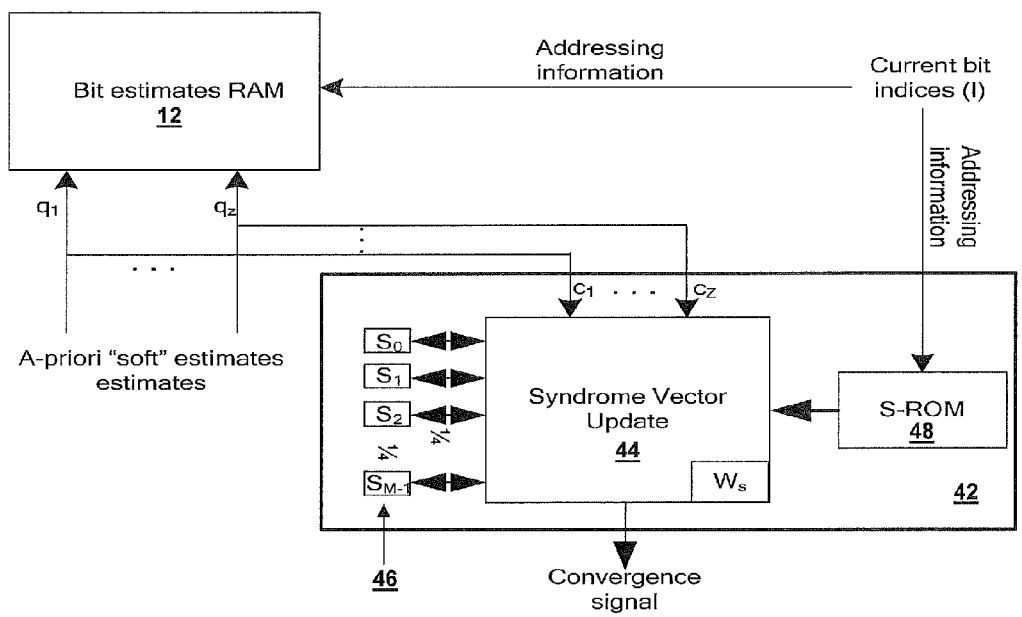
FIG. 4 illustrates how the syndrome vector update block of FIG. 3 may be used to initialize the syndrome vector.

Initialization of the syndrome vector can be performed as follows: prior to decoding, the syndrome vector is reset and initialized with 0's. Then, the initial syndrome vector may be computed during decoder initialization, while filling bit estimates RAM 12 with the initial a-priori "soft" bit estimates. This can be done using syndrome vector update block 44 of FIG. 3, as shown in FIG. 4. During initialization, syndrome vector update block 44 may be driven by the vector of a-priori bit estimates, while during decoding syndrome vector update block 44 is driven by the vector of bit flips. Note that in the context of FIG. 4, all bit indices I are "current". Also note that in the context of FIG. 4, the parameter "Z" denotes the number of a-priori "soft" bit estimates that are loaded simultaneously into bit estimates RAM 12.

Real-time convergence detection block 42 of FIG. 3 is less complex and less power consuming than the real time convergence detection circuitry of FIG. 2. However, convergence detection block 42 may still result in relatively high implementation complexity. The main reason is that many syndrome bits may need to be updated simultaneously. As a result the syndrome vector should not be stored in a low cost RAM (which would allow access to one or at most two addresses simultaneously) and should instead be stored in array 46 of M registers (where M can be in the order of a few hundreds or thousands or more). Moreover, a large number of simultaneous XOR operations is needed ($S=S \oplus H(I_{f=1})$, requires up to Z*M XOR operations). Alternatively, a small number of simultaneous NOT operations may be performed ($S(J(I_{f=1}))=$ NOT $(S(J(I_{f=1})))$), but then a large MUXing layer for choosing the small number of syndrome bits (whose indices are $J(I_{f=1})$) out of the total of M syndrome bits should be implemented.

Figure 5:
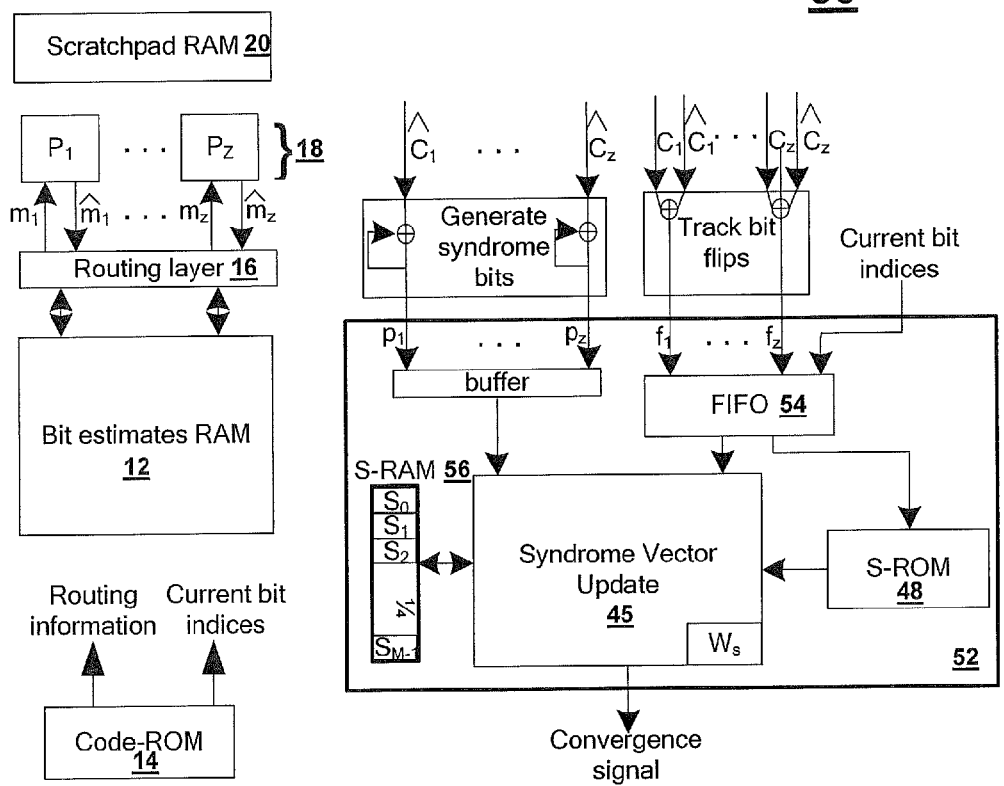
FIG. 5 illustrates a second embodiment of a decoder for real-time decoder convergence detection.

In order to reduce the complexity and power consumption of real time convergence detection block 42 of FIG. 3, a different system, shown in FIG. 5, can be used. Decoder 50 of FIG. 5 may be identical to decoder 40 of FIG. 3 except for the substitution of convergence detection block 52 for convergence detection block 42. During decoding of a sparse parity-check matrix, the average frequency of bit flips is very low. On average, at bit error rates common in Flash memories, a bit may flip once every 10 to 20 decoding clocks. There may still be a burst where several bits flip simultaneously (i.e. in a single clock, or in consecutive clocks), however this is a low probability event. Now, each bit flip requires updating only a few syndrome bits (due to the sparseness of the parity-check matrix), in order to keep the syndrome vector updated. Hence, since bit flips occur at low frequency, a FIFO buffer 54 can be used for storing and managing the bit flip "requests", such that the syndrome vector updating will be done at low frequency, one or a few (e.g. Z) syndrome bits at a time. An advantage of this approach is real-time convergence detection, while having very low complexity and low power consumption. More specifically, the solution depicted in FIG. 5 does not store the syndrome vector in an array of registers—the syndrome vector can be stored in a low cost RAM (depicted as S-RAM 56 in FIG. 5), as the syndrome vector is updated one or a few (Z) bits at a time. Moreover, there is no need for a large MUXing layer and the amount of logic is very low, as only one or a few (e.g. Z) syndrome bits are to be flipped at a time. Syndrome vector update block 45 of convergence detection block 52 is syndrome vector update block 44 of convergence detection block 42, modified to manipulate the syndrome bits in SRAM 56, in response to requests from FIFO buffer 54, instead of in registers 46.

According to convergence detection block 52 of FIG. 5, each time bit flipping is identified within the set of Z soft bit estimates that were updated by processing units 18, a request is inserted in FIFO buffer 54 for flipping the appropriate syndrome bits. This request includes a specification of which out of the Z bits flipped (e.g. Z indicator bits) and the indices (or index) of the current group of bits that generated the request. Syndrome vector update block 45 handles the request in FIFO buffer 54 one by one, as long as FIFO buffer 54 is not empty. Each request may be handled in several processing clocks. For example, if the flipped bit (or flipped bits within the set of Z simultaneously processed bits) that generated the request participates in d parity-checks, then the request may be handled in d clocks, such that in each clock, S-ROM 48 outputs the address A of one syndrome bit (or one set of Z syndrome bits) within S-RAM 56, corresponding to one of the d parity-checks in which the bit(s) participate(s). The syndrome bit(s) at the address(es) is/are updated according to the indicator vector that was stored in FIFO buffer 54 (e.g. S-RAM (A)=S-RAM (A)⊕F). Additionally, the syndrome weight is updated incrementally: $W_s = W_s + N_{0 \to 1} - N_{1 \to 0}$, where $N_{0 \to 1}$ is the number of syndrome bits that flipped from 0 to 1=at the updated S-RAM address(es) A and $N_{1 \to 0}$ is the number of syndrome bits that flipped from 1 to 0 at the updated S-RAM address(es) A.

In order to avoid overflow of FIFO buffer 54 in case of a "burst" of bit flip requests (where each one may require several clocks to process), a sufficiently large FIFO buffer 54 should be allocated. Alternatively, a smaller FIFO buffer 54 can be used, and then in the (low probability) event that FIFO buffer 54 overflows, real-time convergence detection block 52 can be disabled. In this case decoder 50 may run until a maximal number of iterations, or revert to another conventional convergence detection method.

Initialization of the syndrome vector in S-RAM 56 can be done as shown in FIG. 4, during the initialization of decoder 50, while filling bit estimates RAM 12 with the initial a-priori "soft" bit estimates. The initial syndrome vector can be computed one or few (e.g. Z) syndrome bits at a time, during the first decoding iteration, as during the first decoding iteration all the parity-checks are processed anyway. For example, consider a decoder operating according to a serial updating schedule, where the parity-checks of the code are processed one set of Z parity-checks after another, such that a parity-check involving r bits is processed in r clocks. In this case, the syndrome vector initialization is done as follows: prior to decoding, the syndrome vector storage (i.e. S-RAM 56) is initialized with 0's. Then during the first decoding iteration, after each r clocks, an additional set of Z syndrome bits ($P = [p_1 \ldots p_z]$ in FIG. 5) is computed and the syndrome vector and syndrome weight counter are updated accordingly. I.e. S-RAM (n)=S-RAM(n)⊕P, where n is a serial address counter that is incremented once every r clocks. Note that during the first iteration S-RAM 56 is updated by two sources: 1) the generate syndrome bits source (S-RAM(n)=S-RAM (n)⊕P) and 2) the track flip bits source (S-RAM(A)=S-RAM(A)⊕F). Once the first iteration finishes, the syndrome vector and syndrome weight counter are valid. From that point onward, only the track flip bits source updates the syndrome vector and syndrome weight counter and once the syndrome weight counter reaches zero, convergence is detected and decoding is terminated.

Note that because there are two sources updating the syndrome vector during the first decoding iteration, the track flip bits source should update only syndrome bits of previously processed parity-checks. Starting from the second iteration until decoding termination, the track flip bits source updates all the syndrome bits.

According to this low complexity syndrome vector initialization approach, convergence detection block 52 becomes valid as a fast convergence detector only after the first decoding iteration finishes. However, decoder 50 is not expected to converge in less than one iteration anyway (unless the number of errors is zero or almost zero).

Up to this point, the use of convergence detection blocks 42 and 52, as their name implies, has been described for early detection of convergence. A modification of convergence detection blocks 42 and 52 turns them into divergence detection blocks. Instead of comparing $W_s$ to zero, $W_s$ is compared to a non-zero threshold. Typically, this threshold is the value of $W_s$ at a corresponding point in the immediately preceding iteration. Alternatively, this threshold could be a value that $W_s$ is expected to not exceed at a given point in the iterative decoding if the iterative decoding is expected to converge.

Figure 6:
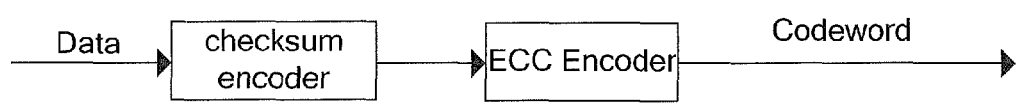
FIG. 6 is a block diagram of an encoder that uses both a checksum and an ECC.

The systems of FIGS. 1-5 can also be used for fast testing of a checksum. A checksum is a code that is used for error detection. When implemented together with Error Correcting Codes, a system may achieve error rates of less than $10^{-14}$ for detected errors and less than $10^{-20}$ for undetected errors. An encoder employing a checksum and an ECC is illustrated in FIG. 6. In FIG. 6, the output of the checksum encoder is a partial codeword that consists of the information bits concatenated with a checksum and the output of the ECC encoder is a full codeword that consists of the partial codeword concatenated with the ECC parity bits.

A checksum may be implemented using a Cyclic Redundancy Code (CRC). A CRC is a cyclic code that ensures that certain patterns of errors will be detected. Patterns detected by a CRC may include all odd number of errors, burst errors up to a given burst length, one or more other types of errors, or any combination thereof.

A CRC may be encoded by embedding the information bits in a polynomial p(x), and multiplying by a generator polynomial g(x) in a certain polynomial ring to generate a code polynomial c(x).

A CRC may be used for error detection by computing its syndrome, which simplifies to multiplying the representation of the code polynomial c(x) by a check polynomial h(x), and success is declared if c(x)·h(x)=0, (in the polynomial ring). The process of computing the syndrome of the CRC via polynomial multiplication cannot be done on-the fly during conventional ECC decoding. It can instead be done after the ECC decoder finishes; hence it incurs additional decoding latency. In order to avoid this additional latency, the methods of real-time Syndrome computation described herein can be applied to real-time, on-the-fly, checksum computation.

Just as a ECC parity-check matrix H is defined for a codeword (the output of the ECC encoder of FIG. 6), so a checksum parity-check matrix may be defined for the partial codeword that is output from the checksum encoder of FIG. 6. In order to do real-time error detection, the checksum parity-check matrix is appended to the parity-check matrix of the ECC. In other words, the parity-check matrix of the ECC is extended by adding rows related to the parity-check matrix of the checksum. Since the ECC parity bits do not participate in the checksum code, all values relating to ECC parity bits are 0 in the additional rows that are related to the checksum. The expanded matrix has the form shown in FIG. 7.

A single unified parity-check matrix may be defined for the checksum and the ECC, and the methods described above can be used for computing a joint syndrome vector for both the checksum and ECC. The first M elements of the joint syndrome vector constitute the ECC syndrome vector S. The remaining elements of the joint syndrome vector constitute the CRC syndrome vector. The ECC syndrome vector may be called the "error correction" syndrome and the CRC syndrome vector may be called the "checksum" syndrome. Note that in iterative coding schemes the ECC parity-check matrix is usually sparse, while the checksum parity-check matrix should be dense. Hence, it may be efficient to use the mechanism depicted in FIG. 5 for updating the ECC syndrome vector (as it is based on the sparseness of the parity-check matrix) and to use the mechanism depicted in FIG. 3 for updating the CRC syndrome vector.

Circuitry of a decoder device that implements a checksum may be simplified based on a particular checksum structure, when used in conjunction with Quasi-Cyclic LDPC (QC-LDPC) ECC codes. Such codes are suitable for use in communication and storage applications. The particular checksum structure allows for reusing the encoder/decoder data path and hence has very low implementation complexity. Moreover, it may be as effective as conventional CRC in detecting errors which were un-detected by the LDPC decoder.

Denote the decoding matrix by H. Preferably the ECC related part of H is a low-density parity-check matrix of an LDPC code. Also the LDPC code may be a QC-LDPC code, such that the low-density parity-check is a block matrix, where each block is a square matrix, and where each square matrix is either 0 or a cyclic permutation matrix (or a sum of cyclic permutation matrices in certain QC-LDPC code families). A cyclic permutation matrix is a matrix of the form $A^k$, while $A=\{a_{ij}\}_{i,j=1}^n$ with $$a_{ij} = \begin{cases} 1 & j-i = 1 (\bmod n) \\ 0 & \text{otherwise} \end{cases} \quad (1)$$

This structure (i.e. a block matrix where each block is a square matrix and where each square matrix is either 0 or a cyclic permutation matrix) allows for very efficient hardware implementation of the LDPC decoder, as it simplifies routing of information (messages in the message passing decoding algorithm) from memories that store LDPC code information to computation units that process information during LDPC decoding. Indeed, most LDPC codes used in industry standards today (both the communications and storage applications) may be based on QC-LDPC codes.

In order for the checksum related part of H to use the same hardware structure for efficient checksum computation, the checksum related part of H may also have a block structure, where each block element is either 0 or a sum of matrices of the form $A^k$. For example, the checksum related part of H may be an array of multiple block elements. Each block element may be a square matrix. Each square matrix may have a zero value for every element in the square matrix (i.e. a "0" block element) or may instead be a sum of matrices of the form $A^k$. (A sum of two square matrices having equal dimensions is a square matrix having the same dimensions.) If a matrix corresponding to the checksum (a "checksum matrix") has the same structure as the QC-LDPC parity-check matrix, then this may imply that the checksum matrix may be expected to be a sparse matrix. However, in order for the checksum matrix to be able to detect with high probability error patterns that are not detected by the ECC (especially patterns with a small number of errors that may be undetected by an LDPC decoder), the checksum matrix should be a non-sparse matrix. However, these apparently contradicting requirements can be resolved, as described herein.

For example, consider a checksum matrix comprised of 32 rows (32 checks).

Assume the LDPC code has a length of 1000 and has "minimal codeword weight" of 20 (i.e. has a codeword with only 20 bits equal to 1).

If the LDPC decoder converged to a legitimate code c' word but failed to converge to a desired codeword c, then most probably the decoder converged to a codeword c'=c+a, where a is a low weight codeword of the code, having weight w. E.g. 'a' may have a weight of only w=~20 (even though the code length is 1000).

As the ECC decoder converged to a wrong codeword, it is desired that this event will be "caught" by the checksum. Success of a checksum matrix to catch an undetected error is declared when the checksum detects an error that was undetected by a previous error correction. In other words success is declared when a codeword does not satisfy the checksum conditions. Failure of a checksum matrix occurs in case errors stay undetected even after checksum matrix computation. This occurs whenever an erroneous codeword satisfied the checksum matrix computation.

Since c is a legitimate codeword then it satisfies the checksum parity-check equations. Hence, the checksum fails to detect the error if the error pattern a also satisfies all the 32 checksum parity-check equations.

A probability of this event may be determined as follows:

A word a of length n and minimal weight w will not satisfy a random parity-check h with d 1-s if $$\sum_{i=0}^{n-1} a_i h_i = 1 (\bmod 2),$$

where $a_i$ are the bits of a (w of the bits are 1 and the others 0), and $h_i$ are the check bits (d of the check bits are 1 and the others 0).

The probability $$pr\left(\sum_{i=0}^{n-1} a_i h_i = 1\right)$$

can be computed as follows:

1. For each i for which $a_i=1$, the probability $pr(a_i h_i=1)$ is given by:

$$p = pr(a_i h_i = 1) = pr(h_i = 1) = d/n$$

2. Assume that the probabilities for the individual coordinates to be 1's (which were computed above) are independent. For small w this is a good approximation. Then, the probability that the parity-check will not be satisfied (i.e.

$$Q = pr\left(\sum_{i=0}^{n-1} a_i h_i = 1\right))$$

can be computed as the probability of having an odd number of $a_i h_i$ terms equal to 1 (out of the w terms that may be equal to 1). This probability is given by:

$$Q = wp(1-p)^{w-1} + \binom{w}{3}p^3(1-p)^{w-3} + \binom{w}{5}p^5(1-p)^{w-5} + \ldots$$

The probability Q can be computed in closed form as follows:

$$1 = ((1-p)+p)^w = 1 + wp(1-p)^{w-1} + \binom{w}{2}p^2(1-p)^{w-2} + \ldots$$

and $$(1-2p)^w = ((1-p)-p)^w = 1 - wp(1-p)^{w-1} + \binom{w}{2}p^2(1-p)^{w-2} + \ldots$$

$$Q = \frac{1-(1-2p)^w}{2} = \frac{1-(1-2d/n)^w}{2}$$

If d=n/2 then Q=1/2 (for any w).
If d=n/10 and w=20 the results are still not far from 0.5:

$$Q = \frac{1-(1-2/10)^{20}}{2} \approx 0.4942$$

However, as d/n becomes smaller, the probability of a parity-check to be unsatisfied by a random error pattern starts to decrease and may be much lower than 0.5. E.g. for d=n/100 and w=20:

$$Q = \frac{1-(1-2/100)^{20}}{2} \approx 0.1662$$

The probability of a checksum with M parity-checks missdetecting an error is the probability of all the M parity-checks of the checksum to be satisfied, which is given by:

Probability of checksum missdetection=$(1-Q)^M$

For a checksum with M=32 parity-checks, each having d=100 ones out of n=1000 bits, the probability to miss-detect an error pattern with weight w=20 will be $$\left(1 - \frac{1-(1-2\cdot 100/1000)^{20}}{2}\right)^{32} = 3.36 \cdot 10^{-10}$$

For a checksum with M=32 parity-checks, each having d=10 ones out of n=1000 bits, the probability to miss-detect an error pattern with weight w=20 will be $$\left(1 - \frac{1-(1-2\cdot 10/1000)^{20}}{2}\right)^{32} = 3 \cdot 10^{-4}$$

This means that in order to have very low miss-detection probabilities non-sparse parity-checks (i.e. parity-checks with large fraction of 1's) should be used.

However, for sake of efficient hardware implementation and reuse of the QC-LDPC decoder data path, a QC-LDPC matrix structure may be used for the checksum, and conventionally QC-LDPC matrices are sparse.

A dense QC-LDPC matrix structure can be constructed that can be used for the checksum matrix and hence satisfy both requirements of having a high density matrix and a QC-LDPC structure (i.e. a block matrix based on permutation matrices).

A checksum matrix may be generated as a block matrix that is composed of sub-matrices that are the sums of permutation sub-matrices. The permutation sub-matrices may be cyclic permutation sub-matrices, i.e. cyclically shifted versions of the identity matrix. The problem described earlier is therefore solved by combining numerous sparse QC structured check sums such that each element in the combination is still sparse and can use the low complexity hardware while combining many such elements makes the overall combination dense.

More formally, the checksum matrix may be constructed as follows:

Let z denote the cyclic permutation block size (also known as lifting factor) of the QC-LDPC ECC code that is to be used in conjunction with the proposed checksum. Let k denote the number of information sub blocks of the QC-LDPC ECC to be used (i.e. an ECC with k×z information bits). Then, a checksum matrix $\Sigma$ of order z×(k·z) can be constructed as $\Sigma=(\Sigma_1 \Sigma_2 \ldots \Sigma_k)$, comprising of k sub-matrices $\Sigma_1, \Sigma_2, \ldots, \Sigma_k$, wherein each sub-matrix $\Sigma_i$ is defined as a sum of $l_i$ matrices $A^{n_{ij}}$ defined by the equation:

$$\sum{}_i = \sum_{j=1}^{l_i} A^{n_{ij}}$$

wherein A is a predefined matrix of order z×z, and $l_i$ are predefined integers, and the numbers $n_{ij}$ are either predefined numbers or randomly selected integer numbers. In some embodiments $l_i \leq (z/2)$ to avoid making $\Sigma_i$ too dense. If $l_i=0$ then $\Sigma_i$ is a zero matrix. In a particular embodiment, A is a z×z permutation matrix. In some embodiments, A is the identity z×z matrix, such that $A^{n_{ij}}$ is a cyclic version of the identity matrix (corresponding to a cyclic permutation matrix).

Based on the proposed checksum matrix, encoding can be performed by encoding (k−1)·z data bits using the dense checksum matrix $\Sigma$ as a parity check matrix to generate a set of k·z encoded data bits, wherein the last 'z' bits constitute the checksum bits. The first encoded data bits may be further encoded using a parity check matrix H, wherein H is a sparse matrix comprised of sub-matrices $H_z$ of order z×z, and each of the sub-matrices is either a 0 matrix or a matrix of the form $A^{n_z}$ for some integer $n_z$ or a sum of the form $$\sum_i A^{n_{zi}}$$

for a set of integers $n_{zi}$

A checksum matrix $\Sigma$ may be generated with a QC-LDPC structure, but with high density. The number of 1's in each parity-check equation (denoted as d) can be determined by the integers $l_i$ that define the checksum matrix $\Sigma$. The parameter d can be computed based on a required checksum detection probability, the number of checksum parity-checks (M) and the expected minimal codeword weight of the LDPC code (w) according to the analysis provided above.

For example: If w=20 for 1 KB information (n=8192) then for z=32, $d_c$=30, $l_i$=z/2 then d=$d_c$×$l_i$=480 and M=32, a checksum misdetection probability may be 3×10$^{-10}$. Here, $d_c$ is the number of $\Sigma_i$ elements out of k which satisfy $\Sigma_i \neq 0$ Further note that the checksum matrix has higher density than the LDPC parity-check matrix. (I.e. if the number of 1's in a parity-check of the LDPC parity-checks matrix (H) is r then d>>r). In an example implementation d≈r×z/2.

Figure 7:
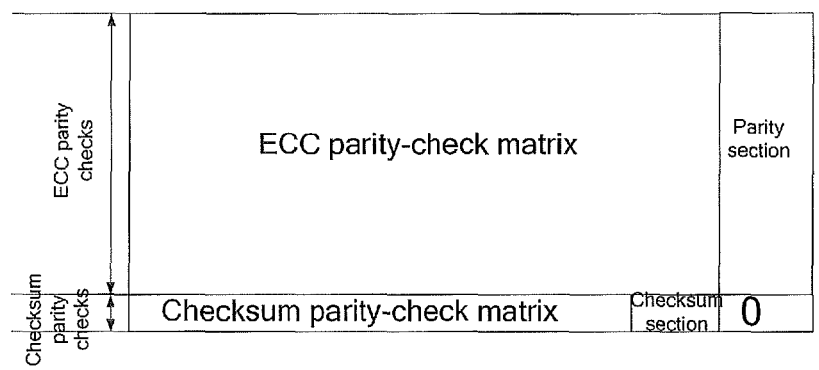
FIG. 7 illustrates an expanded matrix for joint real-time decoder convergence detection and checksum computation.

The unified parity matrix illustrated in FIG. 7 may include a single "strip" of the checksum parity-check matrix, i.e., the checksum parity-check matrix has z rows and may have k·z columns of non-zero elements. The "checksum section" may correspond to the CRC parity bits and therefore may be the z×z identity matrix rather than a sum of permutation matrices. Each of the remaining k−1 blocks of the checksum parity matrix of FIG. 7 may be dense as compared to the sparse ECC parity-check matrix. Alternatively, a unified parity matrix may include multiple "strips" of checksum parity-check matrix, such as by having 2z rows, 3z rows, or more rows. One or more sub-matrices within the checksum parity-check matrix may be sparse—or zero—while continuing to provide substantive checksum strength. For example, if one checksum parity-check strip has a zero sub-matrix in a first position and a second checksum parity-check strip has a zero sub-matrix in a second position that does not coincide with the first position (i.e. the zero portions of the two checksum parity strips do not overlap), the checksum parity-check matrix including the first and second checksum parity-check strips may be sufficiently dense as a whole to satisfy CRC miss-detection probability requirements for a particular implementation.

Figure 8:
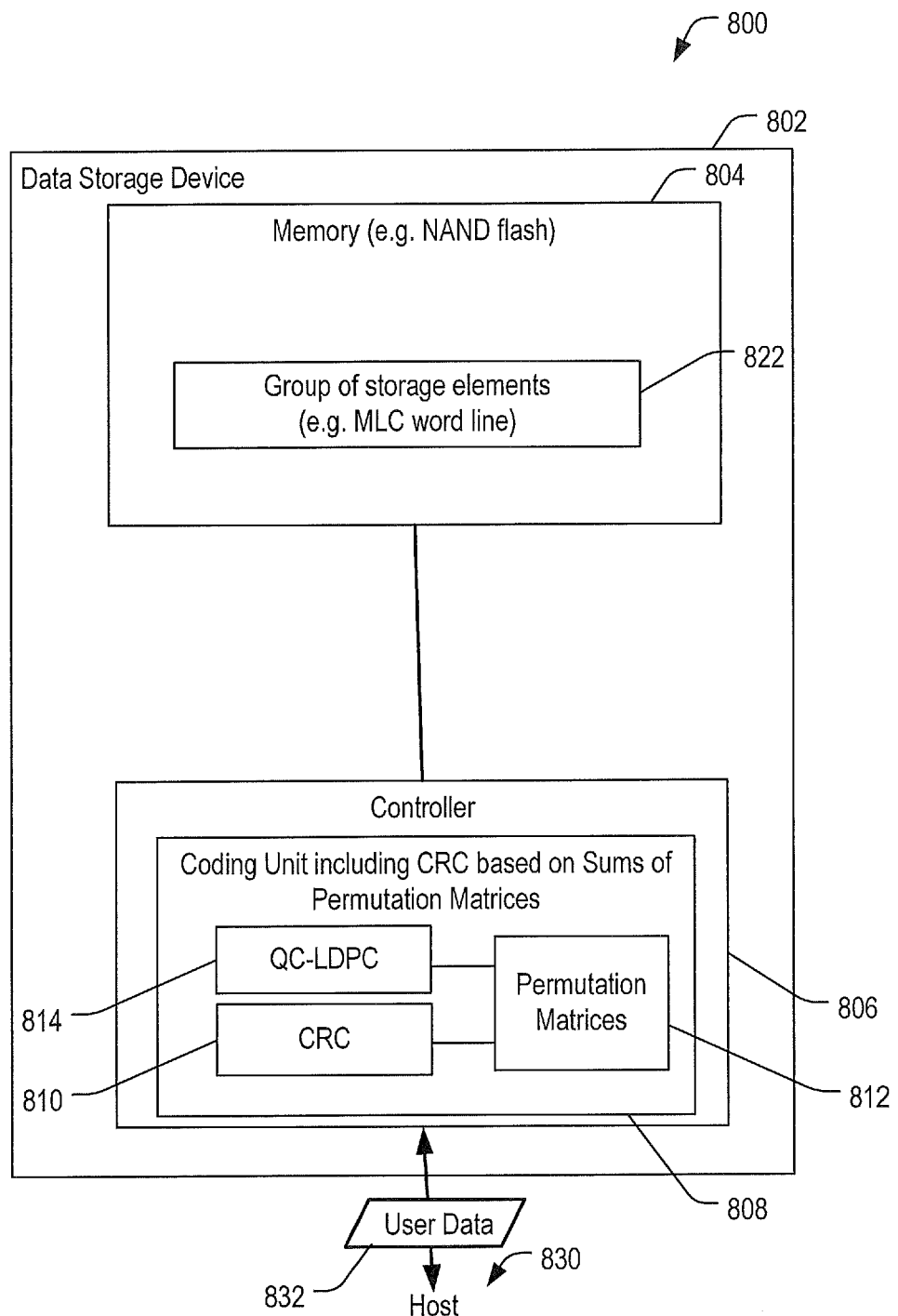
FIG. 8 illustrates a system including a data storage device that includes a coding unit configured to perform CRC processing, where the CRC processing is based on sums of permutation matrices.

Referring to FIG. 8, a particular embodiment of a system 800 is shown. The system 800 includes a data storage device 802. The data storage device 802 includes a memory 804 coupled to a controller 806. The memory 804 (e.g. a NAND flash memory) includes storage elements, such as a representative group of storage elements 822. An example of the group of storage elements 822 is a multilevel cell (MLC) word line. The data storage device 802 is selectively connected to a representative host device 830.

The data storage device 802 may be a solid state disc (SSD) device. The data storage device 802 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 802 may be embedded memory in the host device 830, such as eMMC® (trademark of JEDEC Solid State Technology Association, Arlington, Va.) and eSD, as illustrative examples.

The controller 806 may be a memory controller that includes a coding unit 808 that is configured to perform checksums (such as CRC) based on sums of permutation matrices. The controller 806 may receive user data 832 from the host device 830 for storage and may retrieve data from the memory 804 and may communicate user data 832 that has been requested by the host device 830. Thus, the controller 806 may communicate with the host device 830 and with the memory 804.

The coding unit 808 can be a decoder or an encoder. The coding unit 808 includes a CRC component 810 that is configured to perform CRC computations using sums of permutation matrices 812. For example, the permutation matrices 812 may be cyclic permutation matrices. The CRC component 810 may include the checksum parity-check matrix described with respect to FIG. 7. The coding unit 808 may also include an ECC component, such as an LDPC component, illustrated as a QC-LDPC component 814. The permutation matrices 812 may be used by the QC-LDPC component 814 and by the CRC component 810.

As an example, the coding unit 808 may implement the architecture illustrated in the decoder 10 of FIG. 1 and may include components such as RAM, ROM, and hardware processing devices. In some implementations, the coding unit 808 may be configured to perform convergence detection, such as described with respect to any of FIGS. 2-5, or any combination thereof. In other implementations, the coding unit 808 may not be configured to perform convergence detection as described with respect to any of FIGS. 2-5.

The coding unit 808 may be configured to perform data encoding prior to storage of data at the memory 804. For example, the coding unit 808 may apply a CRC matrix that is based on sums of one or more of the permutation matrices 812 to received user data 832 to generate CRC parity for the user data 832. The coding unit 808 may perform ECC encoding of the user data 832 and the CRC parity, such as via the QC-LDPC component 814, to generate an ECC codeword that is sent to the memory 804 to be stored.

Alternatively, or in addition, the coding unit 808 may be configured to perform decoding of data retrieved from the memory 804. The coding unit 808 may apply an ECC decoding operation, such as via the QC-LDPC component 814, that may return a data word resulting from a convergence of an iterative decoding process. The data word may be provided to the CRC component 810 to compare CRC parity in the data word to CRC parity generated based on a user data portion of the data word. Alternatively, the CRC parity may be generated on-the-fly, such as described with respect to FIG. 5. For example, the controller 806 may be configured to update checksum syndrome values during an iteration of an iterative error correction coding (ECC) decoding operation of a representation of a codeword in response to determining that an estimation of a value of at least one of the data bits has changed. The controller 806 may include a convergence detector (e.g. the convergence detector 52 of FIG. 5) that is configured to generate a convergence signal in response to detecting that all ECC syndrome bits and all CRC syndrome bits associated with decoding the representation of the codeword have a zero value.

Although the coding unit 808 is illustrated as including an ECC component such as the QC-LDPC component 814, it should be recognized that in other embodiments the coding unit 808 may include the CRC component 810 based on sums of one or more of the permutation matrices 812 without also implementing an ECC component.

A method for encoding data bits may be performed at a coding unit of a memory device, such as the coding unit 808 of the data storage device 802. The method may include computing checksum parity bits based on the data bits. A set of equations satisfied by the data bits and the checksum parity bits corresponds to a dense parity-check matrix. For example, a checksum matrix $\Sigma$ of order $z \times (k \cdot z)$ can be constructed as $\Sigma = (\Sigma_1 \ \Sigma_2 \ \ldots \ \Sigma_k)$, based on k sub-matrices $\Sigma_1, \Sigma_2, \ldots, \Sigma_k$, where each sub-matrix $\Sigma_i$ is defined as a sum of $l_i$ matrices $A^{n_{ij}}$. The dense parity-check matrix includes sums of permutation sub-matrices. The permutation sub-matrices may be cyclic permutation sub-matrices (e.g. each sub-matrix $\Sigma_i$ may be defined as a sum of l matrices $A^{n_{ij}}$).

In a particular embodiment, a matrix may be considered "dense" in response to a percentage or proportion of the matrix's elements that have non-zero values exceeding a threshold. The threshold may be 10%, one-third, or one-half, as illustrative, non-limiting examples. To illustrate, the density of the parity-check matrix may correspond to a percentage of the matrix elements that have non-zero values. For example, the dense parity-check matrix may include a number of elements. The dense parity-check matrix may have a density corresponding to at least ten percent of the number of elements being non-zero. As another example, the dense parity-check matrix may have a density corresponding to at least one-third of the number of elements being non-zero. As another example, the dense parity-check matrix may have a density corresponding to substantially half of the number of elements being non-zero.

In another embodiment, a matrix may be considered "dense" in response to a number of permutation sub-matrices that are summed to generate each block of the matrix being larger than a threshold (e.g. $l_i$>threshold for every sub-matrix $\Sigma_i$). The threshold may be a number such as 1 or 2, or may be based on a sub-matrix dimension (e.g. $l_i$>0.4z or $l_i \approx 0.5z$), as illustrative, non-limiting examples. For example, the dense parity-check matrix may have a density corresponding to each of the sums of the permutation sub-matrices being a sum of at least two of the permutation sub-matrices. As another example, the dense parity-check matrix may have a density corresponding to each of the sums of the permutation sub-matrices being a sum of more than two of the permutation sub-matrices. As another example, the dense parity-check matrix may have a density corresponding to each of the sums of the permutation sub-matrices being a sum of a number of the permutation sub-matrices, where the number of permutation sub-matrices is substantially half of a dimension of one of the permutation sub-matrices.

In another embodiment, a matrix may be considered "dense" in response to a ratio of a number of non-zero elements as compared to a total number of elements exceeding a density threshold. For example, the dense parity-check matrix may have a density corresponding to a ratio of a number of non-zero elements of the dense parity-check matrix as compared to a total number of elements of the dense parity-check matrix, and the ratio exceeds a density threshold. As an example, the density threshold may be approximately 0.4. The dense parity-check matrix may be further constrained such that the ratio of non-zero elements to total elements is less than approximately 0.6.

Error correction coding (ECC) parity bits may be computed based on data bits and checksum parity bits. A second set of equations (i.e. corresponding to the ECC parity check matrix of FIG. 7) satisfied by the data bits, the checksum parity bits, and the ECC parity bits may correspond to a sparse parity-check matrix. The sparse parity-check matrix may be limited to permutation sub-matrices and zero sub-matrices.

In a particular embodiment, a matrix may be considered "dense" based on a comparison to another matrix. For example, the dense parity-check matrix may have a density that is at least twice a density of the sparse parity-check matrix. As another example, the dense parity-check matrix may have a density that is at least three times a density of the sparse parity-check matrix.

The sparse parity-check matrix may have a density corresponding to a ratio of a number of non-zero elements of the sparse parity-check matrix as compared to a total number of elements of the sparse parity-check matrix. The ratio may less than a sparsity threshold. For example, the sparsity threshold may be approximately 0.1.

A method of encoding data bits may include constructing a parity check matrix $$\Sigma = (\Sigma_1 \Sigma_2 \ldots \Sigma_k)$$

where $\Sigma$ is of order $z \times (k \cdot z)$ and comprises k sub-matrices $\Sigma_1, \Sigma_2, \ldots, \Sigma_k$, where z and k are integers, where each sub-matrix $\Sigma_i$ is defined as a sum of $l_i$ matrices $A^{n_{ij}}$ as:

$$\Sigma_i = \sum_{j=1}^{l_i} A^{n_{ij}}$$

where A is a predefined matrix of order $z \times z$, and each $l_i$ is a predefined integer, and where the numbers $n_{ij}$ are either predefined numbers or randomly selected integer numbers. The method may also include encoding $(k-1) \cdot z$ data bits using the parity check matrix $\Sigma$ to generate a set of $k \cdot z$ first encoded data bits. The method may be performed at a coding unit of a data storage device, such as at the coding unit 808 of FIG. 8.

The method can also include encoding the first encoded data bits using a parity check matrix H, where H comprises sub-matrices $H_z$ of order $z \times z$. Each of the sub-matrices $H_z$ may be either a 0 matrix or a matrix of the form $A^{n_z}$ ($n_z$ is an integer).

A may be generated by applying a cyclic permutation to rows or columns of the identity matrix of order $z \times z$. In some embodiments, $l_i$ is greater than or equal to $c \cdot z$ and c is a predefined number greater than or equal to 0.4. In some embodiments, z may be greater than or equal to ten. A ratio of a number of non-zero elements in the matrix H as compared to a total number of elements of the matrix H may be less than 0.1.

Although FIG. 8 depicts an implementation of CRC using sums of permutation matrices within a data storage device such as a flash memory card, in other embodiments CRC using sums of permutation matrices may be implemented in other systems. For example, a transmitter may generate CRC parity using sums of permutation matrices (with or without performing ECC encoding, such as QC-LDPC encoding) for transmission of a message over a communication system (e.g. over a wireless network, over a wireline network, or over any combination thereof). A receiver may generate a CRC syndrome to check an integrity of the received message (with or without performing ECC decoding, such as QC-LDPC decoding).

Although various components depicted herein are illustrated as block components and described in general terms, such components may include one or more microprocessors, state machines, or other circuits configured to enable the components (e.g. the coding unit 808 of FIG. 8) to perform the particular functions attributed to such components. For example, the CRC component 810 may represent physical components, such as hardware controllers, state machines, logic circuits, or other structures, to enable the coding unit 808 to perform CRC operations using sums of one or more permutation matrices.

The coding unit 808 may include dedicated hardware (i.e. circuitry) to implement the CRC component 810. Alternatively, or in addition, the coding unit 808 may implement the CRC component 810 using one or more hardware processing units, such as the processors 18 illustrated in FIG. 1. In a particular embodiment, the coding unit 808 includes instructions that are executed by the processors 18 or other processors, and the instructions are stored at the memory 804. Alternatively, or in addition, instructions that are executed by a processor that may be included in the coding unit 808 may be stored at a separate memory location that is not part of the memory 804, such as at a read-only memory (ROM).

In a particular embodiment, the data storage device 802 including the coding unit 808 may be implemented in a portable device configured to be selectively coupled to one or more external devices. However, in other embodiments, the data storage device 802 including the coding unit 808 may be attached or embedded within one or more host devices, such as within a housing of a host portable communication device. For example, the data storage device 802 including the coding unit 808 may be within a packaged apparatus such as a wireless telephone, a personal digital assistant (PDA), a gaming device or console, a portable navigation device, or other device that uses internal non-volatile memory. In a particular embodiment, the coding unit 808 may be coupled to or used in connection with a non-volatile memory, such as a three-dimensional (3D) memory, flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   at a coding unit of a data storage device, performing:
      computing checksum parity bits based on data bits, wherein a set of equations satisfied by the data bits and the checksum parity bits corresponds to a dense parity-check matrix, and wherein the dense parity-check matrix comprises sums of permutation sub-matrices that are generated by applying a cyclic permutation to rows or columns of an identity matrix.

2. The method of claim 1, further comprising computing error correction coding (ECC) parity bits based on the data bits and the checksum parity bits, wherein a second set of equations satisfied by the data bits, the checksum parity bits, and the ECC parity bits correspond to a sparse parity-check matrix.

3. The method of claim 1, wherein the dense parity-check matrix has a density corresponding to a ratio of a number of non-zero elements of the dense parity-check matrix as compared to a total number of elements of the dense parity-check matrix, and wherein the ratio exceeds a density threshold.

4. The method of claim 3, wherein the density threshold is approximately 0.4.

5. The method of claim 4, wherein the ratio is less than approximately 0.6.

6. The method of claim 1, wherein the data storage device includes a three-dimensional (3D) memory having a 3D memory configuration.

7. The method of claim 1, further comprising:
   during an iterative error correction coding (ECC) decoding operation on a representation of a codeword, determining that an estimation of a value of at least one of the data bits has changed; and
   in response to determining that the estimation of the value has changed, updating checksum syndrome values during the iterative ECC decoding operation.

8. A method of encoding data bits, the method comprising:
   in a coding unit of a data storage device:
      constructing a parity check matrix $\Sigma = (\Sigma_1\ \Sigma_2 \ldots \Sigma_k)$;

wherein the parity check matrix $\Sigma$ is of order $z \times (k \cdot z)$ and comprises k sub-matrices $\Sigma_1, \Sigma_2, \ldots, \Sigma_k$, wherein z and k are integers, wherein each sub-matrix $\Sigma_i$ is defined as a sum of $l_i$ matrices $A^{n_{ij}}$ as:

$$\Sigma_i = \sum_{j=1}^{l_i} A^{n_{ij}}$$

wherein A is a predefined matrix of order $z \times z$, and each $l_i$ is a predefined integer, and wherein $n_{ij}$ are either predefined numbers or randomly selected integer numbers; and
      encoding $(k-1) \cdot z$ data bits using the parity check matrix $\Sigma$ to generate a set of $k \cdot z$ first encoded data bits.

9. The method of claim 8, further comprising encoding the $k \cdot z$ first encoded data bits using a parity check matrix H, wherein the parity check matrix H comprises sub-matrices $H_z$ of order $z \times z$, wherein each of the sub-matrices $H_z$ is either a 0 matrix or a matrix of the form $A^{n_z}$ and wherein $n_z$ is an integer.

10. The method of claim 9, wherein a ratio of a number of non-zero elements in the parity check matrix H as compared to a total number of elements of the parity check matrix H is less than 0.1.

11. The method of claim 8, wherein A is generated by applying a cyclic permutation to rows or columns of an identity matrix of order $z \times z$.

12. The method of claim 8, wherein $l_i$, is greater than or equal to $c \cdot z$ and wherein c is a predefined number greater than or equal to 0.4.

13. The method of claim 8, wherein z is greater than or equal to ten.

14. The method of claim 8, wherein the data storage device includes a three-dimensional (3D) memory having a 3D memory configuration.

15. A data storage device comprising:
   a memory; and
   a controller coupled to the memory, wherein the controller is configured to compute checksum parity bits based on data bits, wherein a set of equations satisfied by the data bits and the checksum parity bits corresponds to a dense parity-check matrix, wherein the dense parity-check matrix comprises sums of permutation sub-matrices, and wherein the controller is further configured to update checksum syndrome values during an iteration of an iterative error correction coding (ECC) decoding operation on a representation of a codeword in response to determining that an estimation of a value of at least one of the data bits has changed.

16. The data storage device of claim 15, wherein the controller includes a convergence detector that is configured to generate a convergence signal in response to detecting that all ECC syndrome bits and all cyclic redundancy check (CRC) syndrome bits associated with decoding the representation of the codeword have a zero value.

17. The data storage device of claim 15, wherein the controller includes a coding unit configured to encode the data bits to generate the codeword prior to initiation of the iterative ECC decoding operation, and wherein the controller is further configured to store the codeword to the memory prior to initiation of the iterative ECC decoding operation.

18. The data storage device of claim 15, wherein the controller is further configured to initiate a read process at the memory to generate the representation of the codeword.

19. The data storage device of claim 15, wherein the sums of the permutation sub-matrices are generated by applying a cyclic permutation to rows or columns of an identity matrix having a size corresponding to the permutation sub-matrices.

20. The data storage device of claim 15, wherein the memory includes a three-dimensional (3D) memory having a 3D memory configuration.

\* \* \* \* \*